US009853607B1

(12) United States Patent
Liu et al.

(10) Patent No.: US 9,853,607 B1
(45) Date of Patent: Dec. 26, 2017

(54) LOW-NOISE AMPLIFIER, RECEIVER AND METHOD IN A LOW-NOISE AMPLIFIER

(71) Applicant: Beken Corporation, Shanghai (CN)

(72) Inventors: Jiazhou Liu, Shanghai (CN); Dawei Guo, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 0 days.

(21) Appl. No.: 15/619,553

(22) Filed: Jun. 12, 2017

(30) Foreign Application Priority Data

May 16, 2017 (CN) .......................... 2017 1 0344556

(51) Int. Cl.
| | |
|---|---|
| H03F 3/45 | (2006.01) |
| H03F 1/26 | (2006.01) |
| H03F 3/193 | (2006.01) |
| H04B 1/10 | (2006.01) |

(52) U.S. Cl.
CPC ............. *H03F 1/26* (2013.01); *H03F 3/193* (2013.01); *H04B 1/10* (2013.01); *H03F 2200/294* (2013.01); *H03F 2200/451* (2013.01)

(58) Field of Classification Search
CPC ...... H03F 1/26; H03F 3/193; H03F 2200/294; H03F 2200/451; H04B 1/10
USPC ......................................... 330/252, 311, 254
See application file for complete search history.

(56) References Cited

U.S. PATENT DOCUMENTS

| | | | | |
|---|---|---|---|---|
| 6,882,223 | B2* | 4/2005 | Hsu | ......................... H03F 3/189 330/252 |
| 7,266,360 | B2* | 9/2007 | Kang | ....................... H04B 1/28 330/131 |
| 7,439,811 | B2* | 10/2008 | Kim | ......................... H03F 3/193 330/254 |
| 7,834,704 | B2* | 11/2010 | Hijikata | ................. H03F 1/0205 330/253 |
| 8,203,388 | B2* | 6/2012 | Kathiresan | ............ G06F 1/3203 330/283 |
| 8,289,103 | B2* | 10/2012 | Yamakawa | .......... H03H 7/0115 333/174 |

* cited by examiner

*Primary Examiner* — Sonny Trinh
(74) *Attorney, Agent, or Firm* — Perkins Coie LLP

(57) ABSTRACT

A low-noise amplifier comprises first and second input ports respectively configured to receive a positive and negative input voltages; first and second resonance circuit, first and second transistor; wherein a first voltage output port of the first resonance circuit is connected to the second transistor, and a second voltage output port of the second resonance circuit is connected to the first transistor, the first and second voltage output ports are crossed coupled to a second node of both the first transistor and the second transistor via a first and second capacitor respectively; the second node of the second transistor is connected to both the second input port via a third capacitor and a third node of the first transistor, and the second node of the first transistor is connected to both the first input port via a fourth capacitor and a third node of the second transistor.

11 Claims, 5 Drawing Sheets

LOW-NOISE AMPLIFIER, RECEIVER AND METHOD IN A LOW-NOISE AMPLIFIER

CROSS-REFERENCE TO RELATED APPLICATIONS

This application claims priority to Chinese Application number 201710344556.6 entitled "low-noise amplifier, a receiver and method in a low-noise amplifier," filed on May 16, 2017 by Beken Corporation, which is incorporated herein by reference.

TECHNICAL FIELD

The present application relates to an analog circuit and more particularly, but not exclusively, to a low-noise amplifier, a receiver and method in a low-noise amplifier.

BACKGROUND OF THE INVENTION

Superheterodyne RF receiver comprises a low noise amplifier, a mixer connected to the low noise amplifier (LNA), a filter connected to the mixer, and an analog-to-digital converter connected to the filter. As the mixer has a relatively high noise figure, in order to reduce the noise figure, the front end of the mixer generally has a low-noise amplifier. LNA needs to be matched to the antenna (generally 50 ohm), and LNA also needs high gain to suppress noise of the mixer. LNA further requires a low noise figure to reduce the noise that LNA circuit itself contributes to the system. Further, LNA requires low power consumption to increase battery life for RF systems, and high linearity to reduce the impact of interference to the desired signal. Therefore, a new structure of LNA with low noise figure, low power consumption and high gain is desirable.

BRIEF DESCRIPTION OF THE INVENTION

According to an embodiment of the invention, a low-noise amplifier (LNA), comprises first and second input ports (Vinn, Vinp) respectively configured to receive a positive input voltage and a negative input voltage; a first resonance circuit, a second resonance circuit, a first transistor (M1) and a second transistor (M2); wherein a first voltage output port (Vop) of the first resonance circuit is connected to a first node of the second transistor, and a second voltage output port (Von) of the second resonance circuit is connected to a first node of the first transistor, wherein the first voltage output port and the second voltage output port are crossed coupled to a second node of the first transistor and a second node of the second transistor via a first capacitor and a second capacitor respectively; wherein the second node of the second transistor is connected to both the second input port via a third capacitor and a third node of the first transistor, and the second node of the first transistor is connected to both the first input port via a fourth capacitor and a third node of the second transistor.

According to another embodiment of the invention, A receiver, comprises a low noise amplifier, and configured to output a voltage signal. The low-noise amplifier (LNA), comprises first and second input ports (Vinn, Vinp) respectively configured to receive a positive input voltage and a negative input voltage; a first resonance circuit, a second resonance circuit, a first transistor (M1) and a second transistor (M2); wherein a first voltage output port (Vop) of the first resonance circuit is connected to a first node of the second transistor, and a second voltage output port (Von) of the second resonance circuit is connected to a first node of the first transistor, wherein the first voltage output port and the second voltage output port are crossed coupled to a second node of the first transistor and a second node of the second transistor via a first capacitor and a second capacitor respectively; wherein the second node of the second transistor is connected to both the second input port via a third capacitor and a third node of the first transistor, and the second node of the first transistor is connected to both the first input port via a fourth capacitor and a third node of the second transistor. The receiver further comprises a local oscillator configured to output a frequency signal; a mixer coupled to both the low noise amplifier and the local oscillator and configured to generate a mixed signal by mixing the output voltage with the frequency signal; a filter coupled to the mixer and configured to generate a filtered signal by filtering the mixed signal; an analog to digital converter coupled to the filter and configured to generate a digital signal by converting the filtered signal.

According to another embodiment of the invention, a method in a low-noise amplifier (LNA), wherein the low-noise amplifier comprises: first and second input ports (Vinn, Vinp) respectively configured to receive a positive input voltage and a negative input voltage; a first resonance circuit, a second resonance circuit, a first transistor (M1) and a second transistor (M2); wherein a first voltage output port (Vop) of the first resonance circuit is connected to a drain of the second transistor, and a second voltage output port (Von) of the second resonance circuit is connected to a drain of the first transistor, wherein the first voltage output port and the second voltage output port are cross coupled to a gate of the first transistor and a gate of the second transistor via a first capacitor and a second capacitor respectively; wherein the second node of the second transistor is connected to both the second input port via a third capacitor and a third node of the first transistor, and the second node of the first transistor is connected to both the first input port via a fourth capacitor and a third node of the second transistor; wherein the method comprises: receiving, by the first input port and the second input port, differential input signal; and outputting, by the first voltage output port and the second voltage output port, differential output signal.

As the output cross-coupling capacitors operate, a negative impedance is provided, which can offset the positive impedance generated by the inductance, and result in a very large output impedance. As is known that gain is determined by the product of output impedance and the transconductance gm, a large output impedance can produce a high gain. Low power is the result of a smaller gm. By achieving the same gain, the output impedance of this structure is higher than conventional circuit, therefore a smaller gm is needed, as the circuit has negative impedance to offset the positive equivalent impedance of the inductor, therefore a larger impedance is obtained. Small gm means small current. Low noise figure is the result of increased equivalent transconductance gm. The output cross-coupling capacitance is viewed as a negative capacitance from the input capacitor side. This negative capacitor offsets the capacitance of the Metal Oxide Semiconductor (MOS) transistor, therefore reducing the capacitance of MOS transistor, and improving the equivalent input transconductance gm. With a lower gm, the input equivalent noise reduces, and the noise figure reduces.

BRIEF DESCRIPTION OF THE DRAWINGS

Non-limiting and non-exhaustive embodiments of the present invention are described with reference to the fol

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
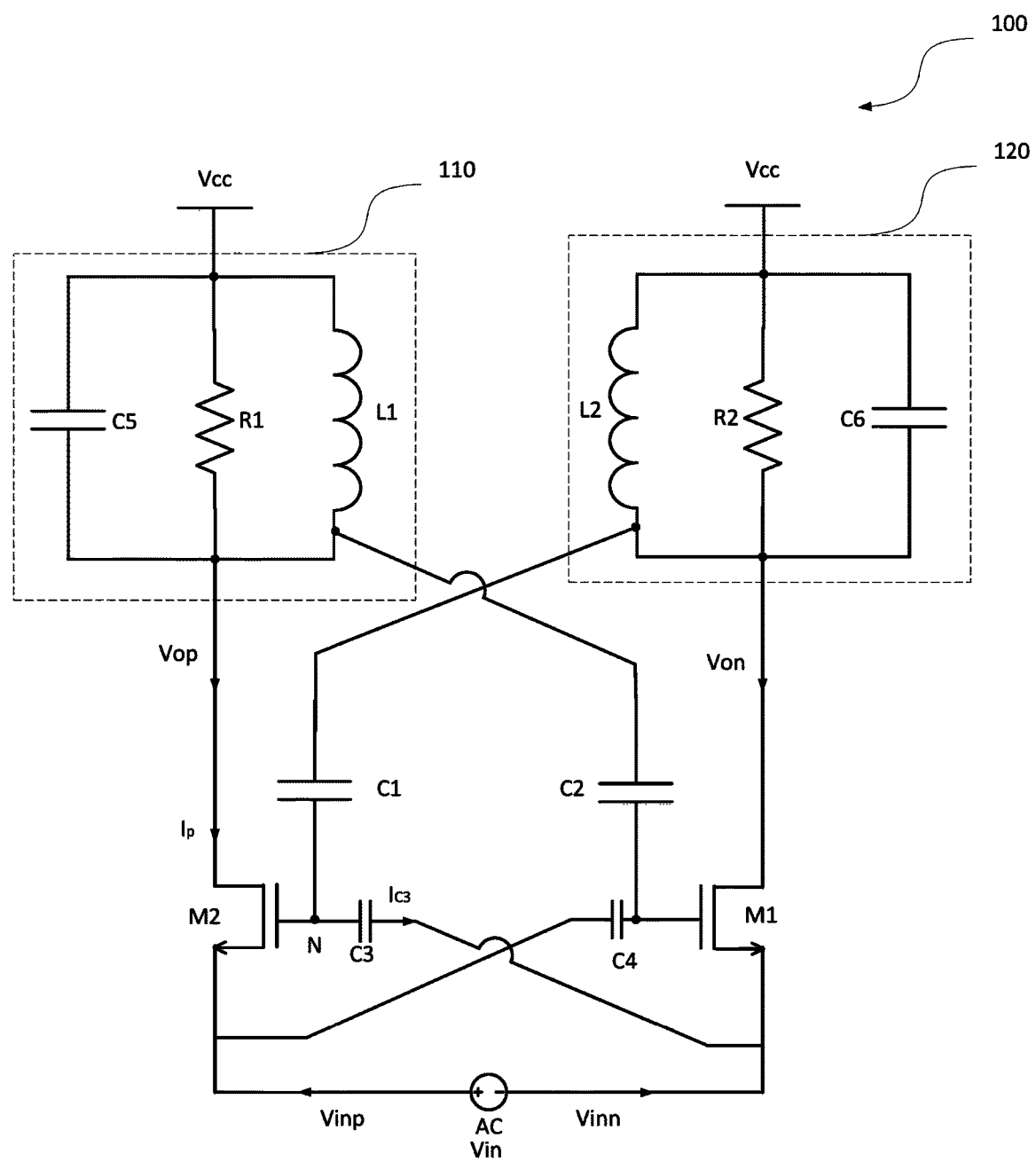
- FIG. 1 is a circuit diagram of a low noise amplifier according to an embodiment of the invention.

FIG. 1 is a circuit diagram of a low noise amplifier 100. The low-noise amplifier (LNA), comprises first and second input ports (Vinn, Vinp) that respectively receive a positive input voltage and a negative input voltage; a first resonance circuit 110, a second resonance circuit 120, a first transistor M1 and a second transistor M2. The first voltage output port Vop of the first resonance circuit 110 is connected to a first node of the second transistor M2. A second voltage output port Von of the second resonance circuit 120 is connected to a first node of the first transistor M1. The first voltage output port Vop corresponds to a positive voltage, and the second voltage output port Von corresponds to a negative voltage.

The first voltage output port Vop and the second voltage output port Von are crossed coupled to a second node of the first transistor M1 and a second node of the second transistor M2 via a first capacitor C1 and a second capacitor C2 respectively. The second node of the second transistor M2 is connected to both the second input port Vinn via a third capacitor C3 and a third node of the first transistor M1. The second node of the first transistor M1 is connected to both the first input port Vinp via a fourth capacitor C4 and a third node of the second transistor M2.

Alternatively, as shown in FIG. 1, the first resonance circuit 110 further comprises a fifth capacitor C5, a first inductor L1 and a first resistor R1, and the second resonance circuit 120 comprises a sixth capacitor C6, a second inductor L2 and a second resistor R2. The fifth capacitor, the first inductor L1 and the first resistor R1 are connected in parallel between a power supply (Vcc) and the first voltage output port Vop. The sixth capacitor C6, the second inductor L2 and the second resistor R2 are connected in parallel between the power supply (Vcc) and the second voltage output port Von.

Figure 2:
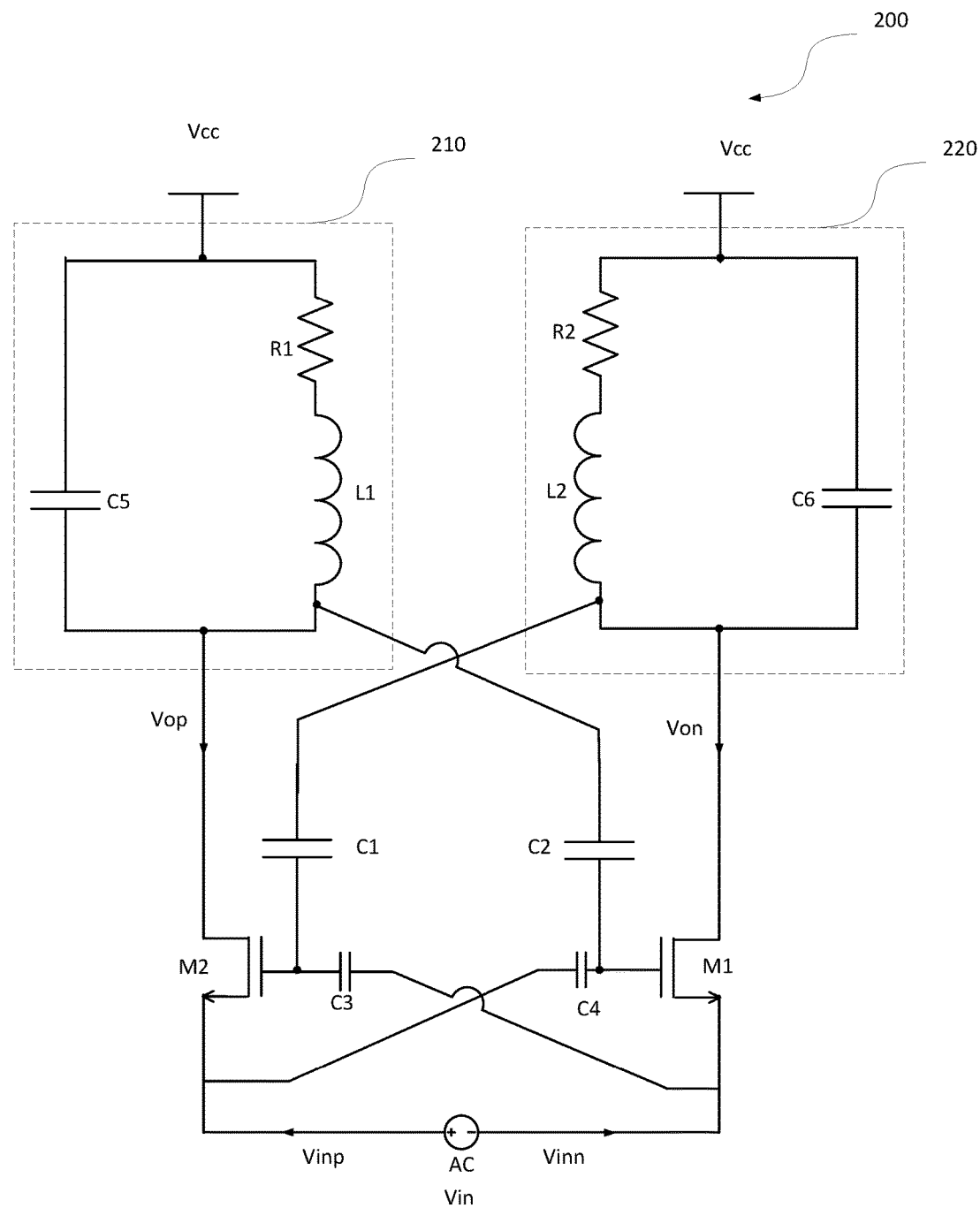
FIG. 2 is a circuit diagram of a low noise amplifier according to another embodiment of the invention.

FIG. 2 is a circuit diagram of a low noise amplifier 200 according to another embodiment of the invention. As shown in FIG. 2, the first resonance circuit 210 further comprises a fifth capacitor C5, a first inductor L1, and a first resistor R1. The second resonance circuit 220 further comprises a sixth capacitor C6, a second inductor L2 and a second resistor R2.

The fifth capacitor C5 is connected in parallel with the serial connection between the first inductor L1 and the first resistor R1, between a power supply Vcc and the first voltage output port Vop. The sixth capacitor C6 is connected in parallel with the serial connection between the second inductor L2 and the second resistor R2 between the power supply Vcc and the second voltage output port Von.

Suppose the gate to source capacitor of the second transistor M2 is Cgs. The output voltage Vn can be represented in the form of input voltage Vn1 as equation (1), which is viewed from the gate of the second transistor M2.

$$V_n = \frac{C_1 V_{n1}}{C_1 + C_{gs} + C_3} \quad (1)$$

Cgs has a positive capacitance, which will result in the voltage decrease on the gate voltage on the second transistor M2 and the first transistor M1 generated by coupling the first input voltage Vinp and the second input voltage Vinn respectively with the third capacitor C3 and the fourth capacitor C4. As a result, the larger the Cgs, the smaller the gain (Vn/Vinn) will be. Wherein Vn represents the input voltage inputted to the gate of the second MOS transistor M2, and Vinn represents Vinn in FIG. 1. Note Vn/Vinn represents the gain on the gate of the second transistor M2 coupled by the third capacitor C3 versus the input.

Cross coupling of the first capacitor C1 and the second capacitor C2 introduces an effective negative capacitor at the input end. Equation (2) below shows the current on the first capacitor C1, and is illustrated as a negative capacitor.

$$I_{c1} = (V_n - V_{on}) \cdot sC_1$$
$$= (V_n - AV_n) \cdot sC_1$$
$$= V_n(1-A) \cdot sC_1$$
$$\approx -AV_n \cdot sC_1 \quad (2)$$

when A>>1

Therefore, the effective capacitance $C_{eff}$ can be represented as $C_{eff} = (1-A) \cdot sC_1$ or approximate to $-A \cdot sC_1$, if $A \rightarrow \infty$, which is a negative capacitor, and can be used to compensate Cgs, thus increasing the gain of the LNA.

As the capacitance introduced by the first capacitor C1 and second capacitor C2 can offset the capacitance introduced by Cgd, the voltage on the input terminals can be substantially lossless transmitted to the input terminals of gates of the first transistor M1 and the second transistor M2. The embodiment enables effective improvement on the gain with relatively small gm, and reduces the input impedance, so as to match input impedance, such as 50 ohm.

With the cross coupling between the first capacitor C1 and the second capacitor C2, an effective negative resistor $R_{neg}$ in the output end is obtained. See the following equation (3) for details.

$$I_p = g_m \times V_{on} \times \frac{C_1}{C_3 + C_1 + C_{gs}} \quad (2)$$

$$R_{neg} = \frac{Vop}{I_p} = \frac{Vop}{g_m \times Von \times \frac{C_1}{C_3 + C_1 + C_{gs}}} = \quad (3)$$

$$\frac{-Von}{g_m \times Von \times \frac{C_1}{C_3 + C_1 + C_{gs}}} = \frac{C_3 + C_1 + C_{gs}}{g_m \times C_1}$$

Therefore, a negative resistor is obtained. Note Ip is the current component caused by second output voltage Von fed to the second MOS transistor M2.

Note the value of the negative resistance $R_{neg}$ is related to the capacitance of the fifth capacitor C5, the first capacitor C1, and capacitor Cgs related to devices. By adjusting the ratio, the value of the negative resistance $R_{neg}$ can be controlled, therefore the Resistance of first resistor R1 can be offset, so as to improve the output impedance, and increase voltage gain increase.

Further, as $g_m$ has decreased, the noise current decreases, therefore a lower noise figure can be obtained. Under the same devices (for example, the same first transistor M1 and the same second transistor M2) and the same current, equivalent transconductance gm increases. In order to maintain the same equivalent transconductance gm, device transconductance gm can be reduced, therefore the current is reduced, while the equivalent transconductance gm maintains constant, therefore the noise on decreased.

$$I_{op} = g_m \times (V_{inp} + V_{in}) \quad (4)$$
$$= g_m V_{inp} \left(1 + \frac{C_3}{C_3 + C_{gs}}\right) \text{ when } C_{gs} \approx 0.$$
$$\approx 2 g_m V_{inp}$$

In summary, the introduction of the first capacitor C1 and the second capacitor C2 reduces current, lowers noise figure and increases the voltage gain.

Alternatively, as shown in FIG. 2, the first transistor M1 comprises a NMOS transistor and the second transistor M2 comprises a NMOS transistor. The first node of the first transistor M1 comprises a drain. The second node of the first transistor M1 comprises a gate. The third node of the first transistor M1 comprises a source. Further, the first node of the second transistor M2 comprises a drain. The second node of the second transistor M2 comprises a gate. The third node of the second transistor M2 comprises a source. The first resonance circuit 210 is connected to a power supply Vcc on a port different from the first voltage output port Vop. The second resonance circuit 220 is connected to the power supply Vcc on a port different from the second voltage output port Von.

Figure 3:
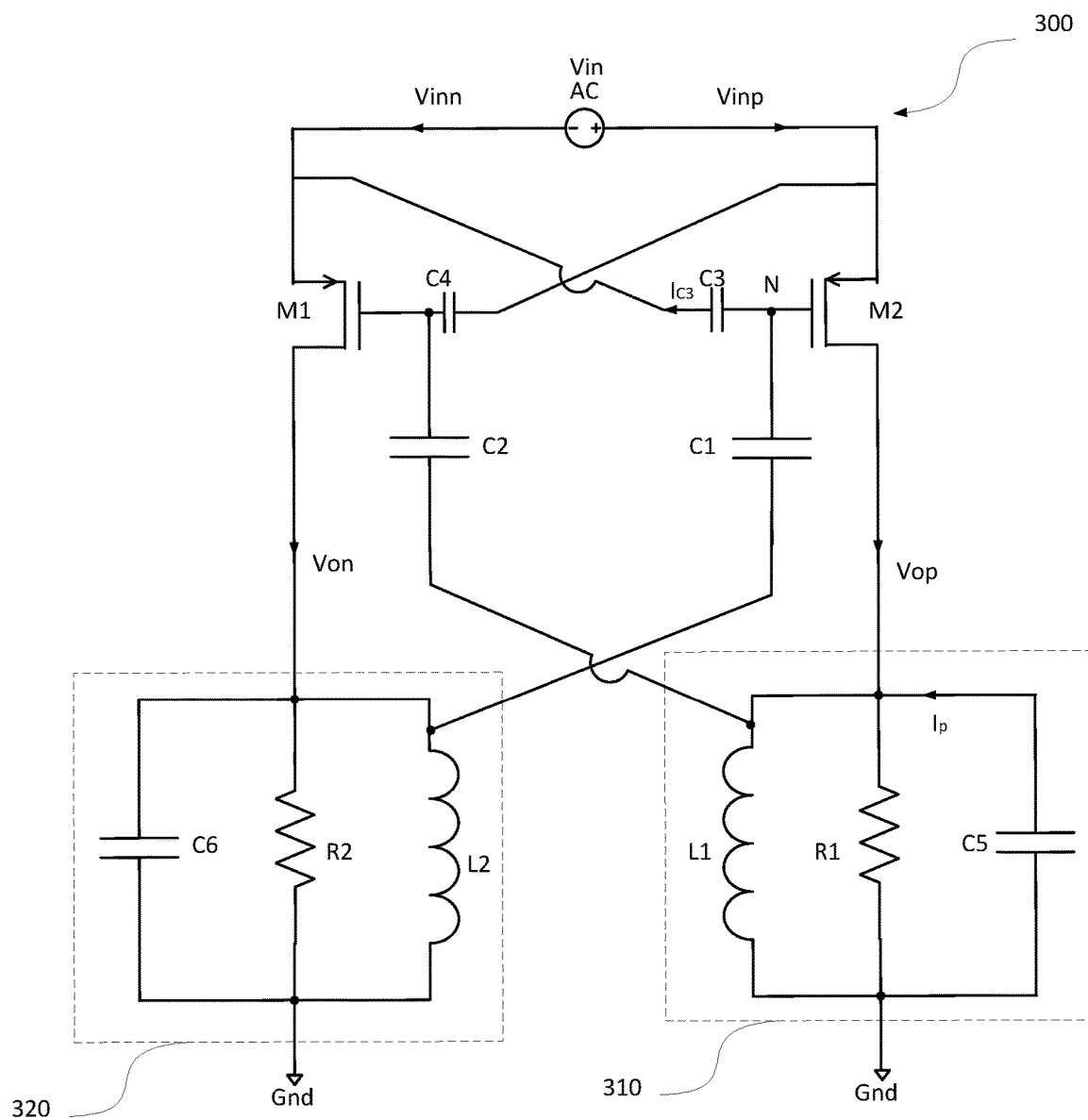
FIG. 3 is a circuit diagram of a low noise amplifier according to another embodiment of the invention.

FIG. 3 is a circuit diagram of a low noise amplifier according to another embodiment of the invention. Compared with the circuit diagram shown in FIG. 1 or FIG. 2, the NMOS transistors M1 and M2 are replaced respectively with PMOS transistors.

The first transistor comprises a PMOS transistor and the second transistor comprises a PMOS transistor. The first node of the first transistor comprises a drain. The second node of the first transistor comprises a gate. The third node of the first transistor comprises a source. Further, the first node the second transistor comprises a drain. The second node of the second transistor comprises a gate. The third node of the second transistor comprises a source. A first resonance circuit 310 is connected to ground on a port different from the first voltage output port Vop. The second resonance circuit 320 is connected to the ground on a port different from the second voltage output port Von.

Figure 4:
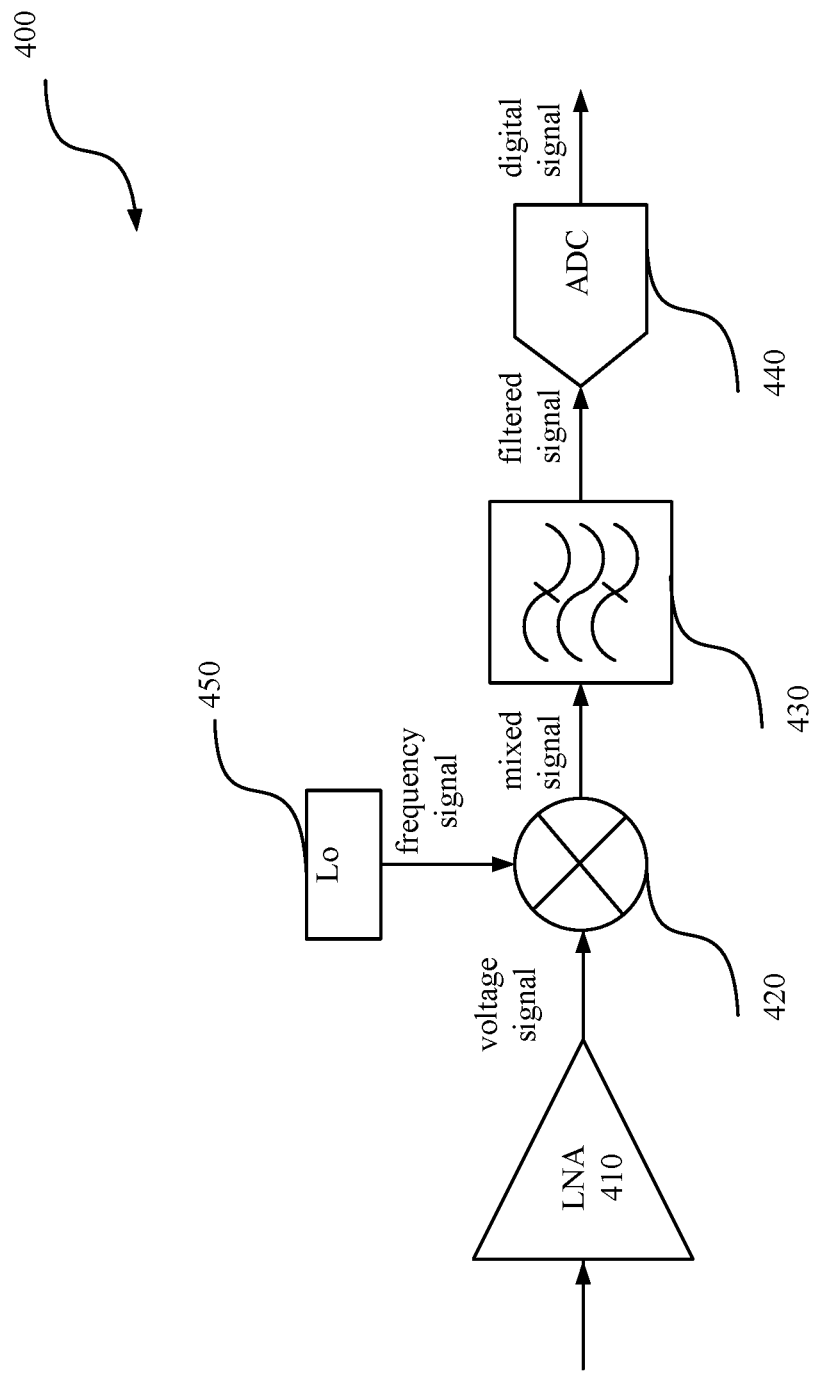
FIG. 4 is a receiver according to an embodiment of the invention.

FIG. 4 is a receiver according to an embodiment of the invention. The receiver 400 comprises a low noise amplifier (LNA) 410, a mixer 420, a filter 430 and an analog to digital converter 440. The low noise amplifier 410 are structured according to any of FIGS. 1, 2 and 3, and the low noise amplifier 410 outputs a voltage signal. A local oscillator 450 outputs a frequency signal to the mixer 420. The mixer 420 is coupled to both the low noise amplifier 410 and the local oscillator and generates a mixed signal by mixing the output voltage with the frequency signal. The filter 430 is coupled to the mixer 420 and generates a filtered signal by filtering the mixed signal. The analog to digital converter 440 is coupled to the filter 430 and generates a digital signal by converting the filtered signal.

Figure 5:
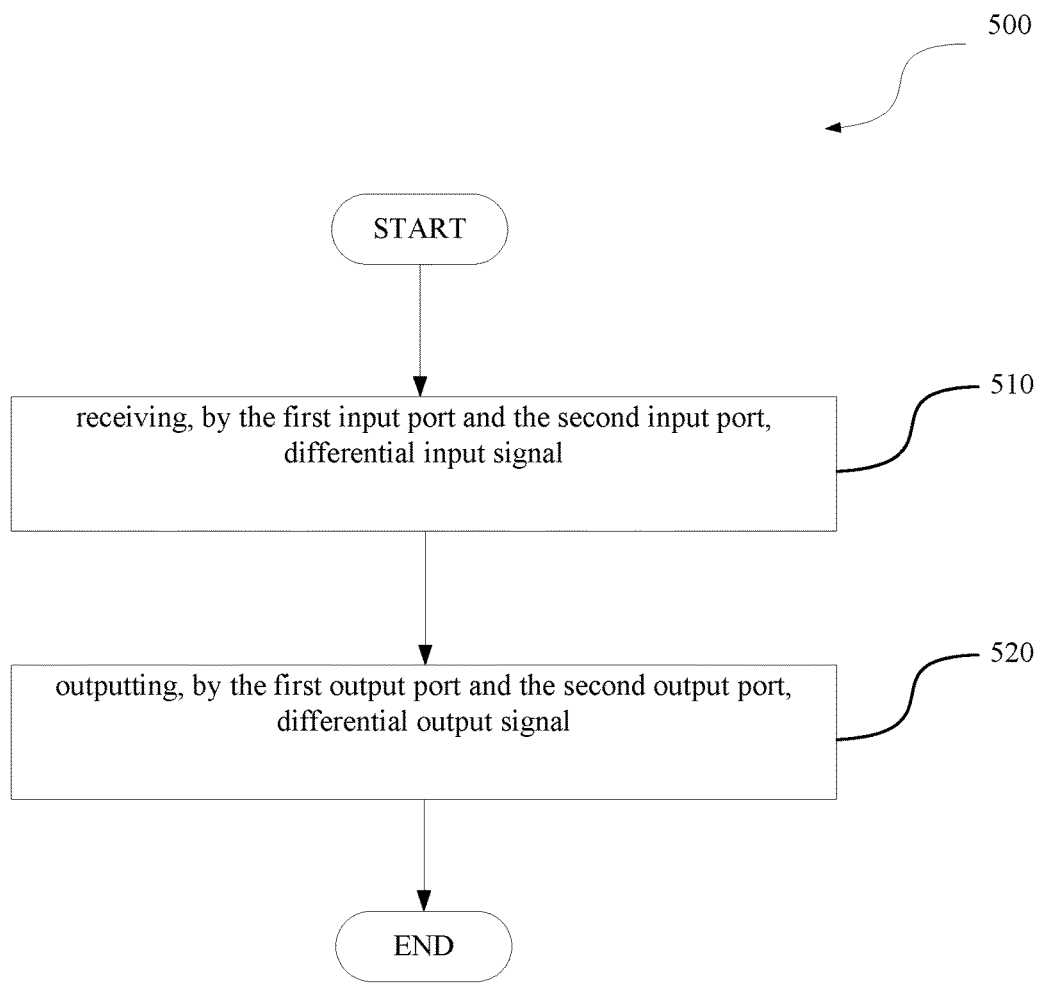
FIG. 5 is a flow chart illustrating a method of operating a low noise amplifier according to an embodiment of the invention.

FIG. 5 is a flow chart illustrating a method 500 of operating a low noise amplifier according to an embodiment of the invention. The method 500 is implemented in a low-noise amplifier (LNA). The low-noise amplifier comprises first and second input ports (Vinn, Vinp) respectively configured to receive a positive input voltage and a negative input voltage; a first resonance circuit, a second resonance circuit, a first transistor (M1) and a second transistor (M2). A first voltage output port (Vop) of the first resonance circuit is connected to a drain of the second transistor. A second voltage output port (Von) of the second resonance circuit is connected to a drain of the first transistor. The first voltage output port and the second voltage output port are cross coupled to a gate of the first transistor and a gate of the second transistor via a first capacitor and a second capacitor respectively. The second node of the second transistor is connected to both the second input port via a third capacitor and a third node of the first transistor, and the second node of the first transistor is connected to both the first input port via a fourth capacitor and a third node of the second transistor. The method 500 further comprises receiving in block 510, by the first input port and the second input port, differential input signal; and outputting in block 520, by the first voltage output port and the second voltage output port, differential output signal.

Alternatively, the low-noise amplifier further comprises a fifth capacitor, a sixth capacitor, a first inductor, a second inductor, a first resistor, a second resistor; wherein both the fifth capacitor and the first inductor are connected in parallel between a power supply (Vcc) and the first voltage output port, and both the sixth capacitor and the second inductor are connected in parallel between the power supply (Vcc) and the second voltage output port.

Alternatively, the low-noise amplifier further comprises a fifth capacitor, a sixth capacitor, a first inductor, a second inductor, a first resistor, a second resistor; wherein both the fifth capacitor and a serial connection between the first inductor and the first resistor are connected in parallel between a power supply (Vcc) and the first voltage output port, and both the sixth capacitor and a serial connection between the second inductor and the second resistor are connected in parallel between the power supply (Vcc) and the second voltage output port.

Alternatively, the first transistor comprises a NMOS transistor and the second transistor comprises a NMOS transistor, wherein the first node of the first transistor comprises a drain, the second node of the first transistor comprises a gate, the third node of the first transistor comprises a source; and wherein the first node of the second transistor comprises a drain, the second node of the second transistor comprises a gate, the third node of the second transistor comprises a source; and the first resonance circuit is connected to a power supply on a port different from the first voltage output port, and the second resonance circuit is connected to the power supply on a port different from the second voltage output port.

Alternatively, the first transistor comprises a PMOS transistor and the second transistor comprises a PMOS transistor, wherein the first node of the first transistor comprises a drain, the second node of the first transistor comprises a gate, the third node of the first transistor comprises a source; wherein the first node of the second transistor comprises a drain, the second node of the second transistor comprises a gate, the third node of the second transistor comprises a source; and the first resonance circuit is connected to ground on a port different from the first voltage output port, and the second resonance circuit is connected to the ground on a port different from the second voltage output port.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

What is claimed is:

1. A low-noise amplifier (LNA), comprising:
   first and second input ports (Vinn, Vinp) respectively configured to receive a positive input voltage and a negative input voltage;
   a first resonance circuit, a second resonance circuit, a first transistor (M1) and a second transistor (M2);
   wherein a first voltage output port (Vop) of the first resonance circuit is connected to a first node of the second transistor, and a second voltage output port (Von) of the second resonance circuit is connected to a first node of the first transistor,
   wherein the first voltage output port and the second voltage output port are crossed coupled to a second node of the first transistor and a second node of the second transistor via a first capacitor and a second capacitor respectively;
   wherein the second node of the second transistor is connected to both the second input port via a third capacitor and a third node of the first transistor, and the second node of the first transistor is connected to both the first input port via a fourth capacitor and a third node of the second transistor.

2. The low-noise amplifier (LNA) of claim 1, further comprises a fifth capacitor, a sixth capacitor, a first inductor, a second inductor, a first resistor, a second resistor;
   wherein both the fifth capacitor and the first inductor are connected in parallel between a power supply (Vcc) and the first voltage output port, and
   both the sixth capacitor and the second inductor are connected in parallel between the power supply (Vcc) and the second voltage output port.

3. The low-noise amplifier (LNA) of claim 1, further comprises a fifth capacitor, a sixth capacitor, a first inductor, a second inductor, a first resistor, a second resistor;
   wherein both the fifth capacitor and a serial connection between the first inductor and the first resistor are connected in parallel between a power supply (Vcc) and the first voltage output port, and
   both the sixth capacitor and a serial connection between the second inductor and the second resistor are connected in parallel between the power supply (Vcc) and the second voltage output port.

4. The low-noise amplifier (LNA) of claim 1, wherein the first transistor comprises a NMOS transistor and the second transistor comprises a NMOS transistor,
   wherein the first node of the first transistor comprises a drain, the second node of the first transistor comprises a gate, the third node of the first transistor comprises a source;
   wherein the first node of the second transistor comprises a drain, the second node of the second transistor comprises a gate, the third node of the second transistor comprises a source; and
   the first resonance circuit is connected to a power supply on a port different from the first voltage output port, and the second resonance circuit is connected to the power supply on a port different from the second voltage output port.

5. The low-noise amplifier (LNA) of claim 1, wherein the first transistor comprises a PMOS transistor and the second transistor comprises a PMOS transistor,
   wherein the first node of the first transistor comprises a drain, the second node of the first transistor comprises a gate, the third node of the first transistor comprises a source;
   wherein the first node of the second transistor comprises a drain, the second node of the second transistor comprises a gate, the third node of the second transistor comprises a source; and
   the first resonance circuit is connected to ground on a port different from the first voltage output port, and the second resonance circuit is connected to the ground on a port different from the second voltage output port.

6. A receiver, comprising
   a low noise amplifier according to claim 1, and configured to output a voltage signal;
   a local oscillator configured to output a frequency signal;
   a mixer coupled to both the low noise amplifier and the local oscillator and configured to generate a mixed signal by mixing the output voltage with the frequency signal;
   a filter coupled to the mixer and configured to generate a filtered signal by filtering the mixed signal;
   an analog to digital converter coupled to the filter and configured to generate a digital signal by converting the filtered signal.

7. A method in a low-noise amplifier (LNA), wherein the low-noise amplifier comprises:
   first and second input ports (Vinn, Vinp) respectively configured to receive a positive input voltage and a negative input voltage;
   a first resonance circuit, a second resonance circuit, a first transistor (M1) and a second transistor (M2);
   wherein a first voltage output port (Vop) of the first resonance circuit is connected to a drain of the second transistor, and a second voltage output port (Von) of the second resonance circuit is connected to a drain of the first transistor,
   wherein the first voltage output port and the second voltage output port are cross coupled to a second node of the first transistor and a second node of the second transistor via a first capacitor and a second capacitor respectively;

wherein the second node of the second transistor is connected to both the second input port via a third capacitor and a third node of the first transistor, and the second node of the first transistor is connected to both the first input port via a fourth capacitor and a third node of the second transistor;

wherein the method comprises:

receiving, by the first input port and the second input port, differential input signal; and outputting, by the first voltage output port and the second voltage output port, differential output signal.

8. The method of claim 7, wherein the low-noise amplifier further comprises a fifth capacitor, a sixth capacitor, a first inductor, a second inductor, a first resistor, a second resistor;

wherein both the fifth capacitor and the first inductor are connected in parallel between a power supply (Vcc) and the first voltage output port, and both the sixth capacitor and the second inductor are connected in parallel between the power supply (Vcc) and the second voltage output port.

9. The method of claim 7, wherein the low-noise amplifier further comprises a fifth capacitor, a sixth capacitor, a first inductor, a second inductor, a first resistor, a second resistor;

wherein both the fifth capacitor and a serial connection between the first inductor and the first resistor are connected in parallel between a power supply (Vcc) and the first voltage output port, and both the sixth capacitor and a serial connection between the second inductor and the second resistor are connected in parallel between the power supply (Vcc) and the second voltage output port.

10. The method of claim 7, wherein the first transistor comprises a NMOS transistor and the second transistor comprises a NMOS transistor, wherein the first node of the first transistor comprises a drain, the second node of the first transistor comprises a gate, the third node of the first transistor comprises a source; and wherein the first node of the second transistor comprises a drain, the second node of the second transistor comprises a gate, the third node of the second transistor comprises a source; and the first resonance circuit is connected to a power supply on a port different from the first voltage output port, and the second resonance circuit is connected to the power supply on a port different from the second voltage output port.

11. The method of claim 7, wherein the first transistor comprises a PMOS transistor and the second transistor comprises a PMOS transistor, wherein the first node of the first transistor comprises a drain, the second node of the first transistor comprises a gate, the third node of the first transistor comprises a source;

wherein the first node of the second transistor comprises a drain, the second node of the second transistor comprises a gate, the third node of the second transistor comprises a source; and the first resonance circuit is connected to ground on a port different from the first voltage output port, and the second resonance circuit is connected to the ground on a port different from the second voltage output port.

* * * * *